US009780020B2

(12) United States Patent
Shimizu

(10) Patent No.: US 9,780,020 B2
(45) Date of Patent: Oct. 3, 2017

(54) WIRING SUBSTRATE AND SEMICONDUCTOR DEVICE

(71) Applicant: SHINKO ELECTRIC INDUSTRIES CO., LTD., Nagano-Shi, Nagano-Ken (JP)

(72) Inventor: Hiroshi Shimizu, Nagano (JP)

(73) Assignee: Shinko Electric Industries Co., Ltd. (JP)

( * ) Notice: Subject to any disclaimer, the term of this patent is extended or adjusted under 35 U.S.C. 154(b) by 0 days.

(21) Appl. No.: 15/366,530

(22) Filed: Dec. 1, 2016

(65) Prior Publication Data

US 2017/0170104 A1    Jun. 15, 2017

(30) Foreign Application Priority Data

Dec. 11, 2015 (JP) ................................ 2015-242390

(51) Int. Cl.
| H01L 23/498 | (2006.01) |
| H01L 23/00 | (2006.01) |
| H01L 21/48 | (2006.01) |

(52) U.S. Cl.
CPC ...... *H01L 23/49811* (2013.01); *H01L 21/481* (2013.01); *H01L 21/4853* (2013.01); *H01L 23/49822* (2013.01); *H01L 23/49827* (2013.01); *H01L 24/10* (2013.01); *H01L 24/16* (2013.01); *H01L 2224/16227* (2013.01); *H01L 2224/16238* (2013.01)

(58) Field of Classification Search
CPC ......... H01L 23/49811; H01L 23/49822; H01L 23/49827; H01L 23/49833; H01L 24/10
See application file for complete search history.

(56) References Cited

U.S. PATENT DOCUMENTS

| 2006/0244128 | A1* | 11/2006 | Hayashi | ............. | H01L 21/4853 257/712 |
| 2015/0245473 | A1* | 8/2015 | Shimizu | ............... | H05K 1/0298 257/778 |

FOREIGN PATENT DOCUMENTS

JP    2006-080571 A    3/2006

* cited by examiner

*Primary Examiner* — Phat X Cao
(74) *Attorney, Agent, or Firm* — Tarolli, Sundheim, Covell & Tummino LLP

(57) ABSTRACT

A wiring substrate includes a wiring layer located on an insulation layer, and a protective insulation layer covering the wiring layer and the insulation layer. The protective insulation layer includes an opening that partially exposes the wiring layer. The wiring layer includes first and second metal layers. The first metal layer is located at a position corresponding to the opening and has a larger contour than the opening in a plan view. The second metal layer includes a pad portion, which covers upper and side surfaces of the first metal layer, and a wiring portion. The opening is extended in the protective insulation layer from an upper surface of the protective insulation layer to the upper surface of the pad portion by a distance that is shorter than that from the upper surface of the protective insulation layer to an upper surface of the wiring portion.

10 Claims, 6 Drawing Sheets

WIRING SUBSTRATE AND SEMICONDUCTOR DEVICE

CROSS-REFERENCE TO RELATED APPLICATIONS

This application is based upon and claims the benefit of priority from prior Japanese Patent Application No. 2015-242390, filed on Dec. 11, 2015, the entire contents of which are incorporated herein by reference.

FIELD

This disclosure relates to a wiring substrate, a semiconductor device, and a method for manufacturing a wiring substrate.

BACKGROUND

Electronic components such as semiconductor elements are mounted on wiring substrate of various shapes and various structures. Recent semiconductor elements have become highly integrated and highly sophisticated. This has increased the demand for finer wirings formed in a wiring substrate on which a semiconductor element is mounted. Japanese Laid-Open Patent Publication No. 2006-80571 describes one example of a wiring substrate. In the wiring substrate, a solder resist is formed on a base substrate, on which a wiring pattern is formed, to serve as a protective insulation layer. The wiring pattern is partially exposed from the solder resist to serve as connection pads.

The solder resist has a greater thickness than the wiring pattern. The solder resist includes openings, each of which has a small diameter and exposes a portion of the wiring pattern as a connection pad. The connection pads, which are exposed from the openings, are electrically connected to a semiconductor element. In such a solder resist, residues may form on an upper surface of the wiring pattern depending on the aspect ratio (ratio of depth to diameter) of the openings. Such residues on the wiring pattern may lead to a defect in electrical connection between the wiring substrate and the semiconductor element.

SUMMARY

One embodiment of this disclosure is a wiring substrate. The wiring substrate includes a wiring layer located on an insulation layer and a protective insulation layer located on the insulation layer and the wiring layer to cover the wiring layer and the insulation layer. The protective insulation layer includes an opening that partially exposes the wiring layer. The wiring layer includes a first metal layer and a second metal layer. The first metal layer is located at a position corresponding to the opening and has a larger contour than the opening in a plan view. The second metal layer includes a pad portion and a wiring portion. The pad portion covers an upper surface of the first metal layer and a side surface of the first metal layer. The opening of the protective insulation layer partially exposes an upper surface of the pad portion. The opening is extended in the protective insulation layer from an upper surface of the protective insulation layer to the upper surface of the pad portion by a distance that is shorter than that from the upper surface of the protective insulation layer to an upper surface of the wiring portion.

Other embodiments and advantages thereof will become apparent from the following description, taken in conjunction with the accompanying drawings, illustrating by way of example the principles of this disclosure.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which.

DESCRIPTION OF THE EMBODIMENTS

Figure 1A:
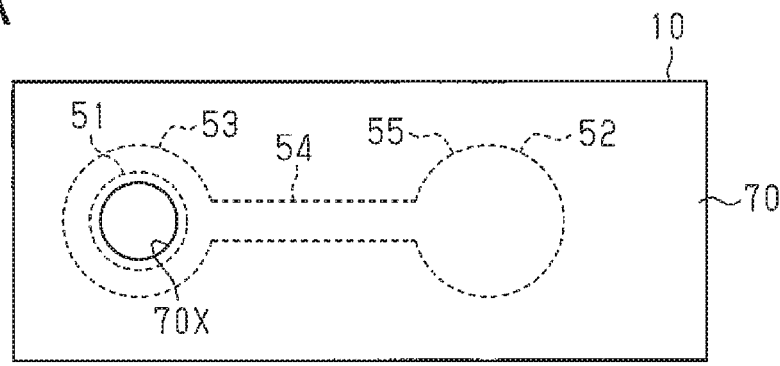
FIG. 1A is a schematic plan view of a wiring substrate.

One embodiment will now be described with reference to the accompanying drawings. Elements in the drawings may be partially enlarged to facilitate understanding of features and thus have not necessarily been drawn to scale. Also, hatching lines may not be illustrated in the cross-sectional drawings to facilitate understanding of the cross-sectional structure of each element.

A semiconductor device 1 will now be briefly described.

Figure 2:
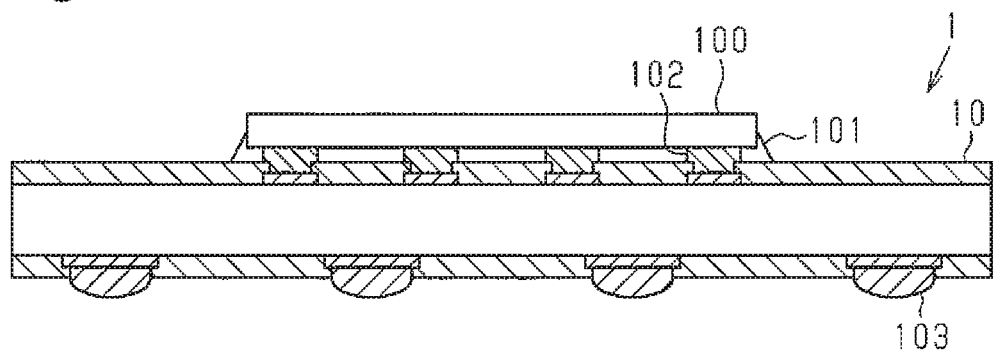
FIG. 2 is a schematic cross-sectional view of a semiconductor package.

As illustrated in FIG. 2, the semiconductor device 1 includes a wiring substrate 10, a semiconductor element 100, which is mounted on the wiring substrate 10, and an underfill resin 101, which is located between the wiring substrate 10 and the semiconductor element 100.

The wiring substrate 10 includes an upper surface on which the semiconductor element 100 is mounted with solder members 102. The solder members 102 are each, for example, a solder bump. The wiring substrate 10 includes a lower surface on which solder bumps 103 are formed. The solder bumps 103 are external connection terminals, which are used for mounting the semiconductor device 1 (wiring substrate 10) on a mount board such as a motherboard. The external connection terminals may be solder balls, lead pins, stud bumps, or the like.

Figure 1B:
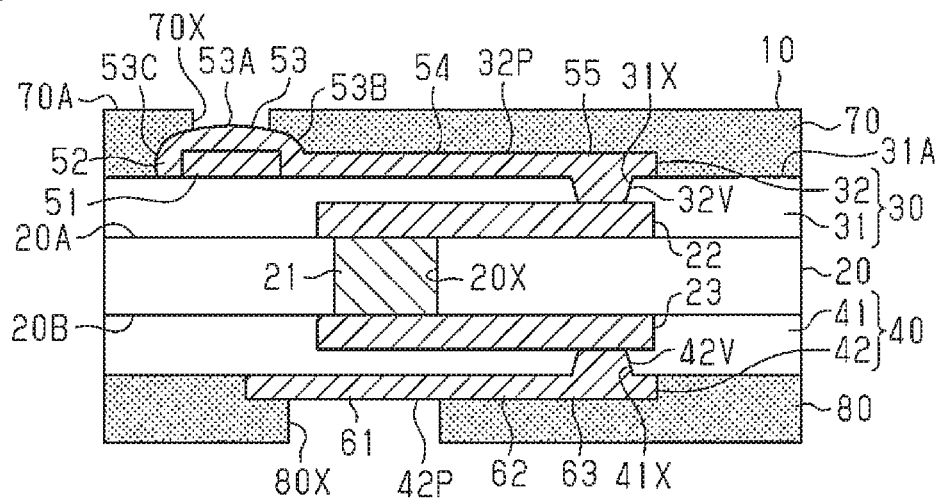
FIG. 1B is a schematic cross-sectional view illustrating the wiring substrate of FIG. 1A.

FIGS. 1A and 1B each schematically illustrate a portion of the wiring substrate 10.

As illustrated in FIG. 1B, the wiring substrate 10 includes a core substrate 20, a wiring lamination unit 30, which is formed on an upper surface 20A of the core substrate 20, a wiring lamination unit 40, which is formed on a lower surface 20B of the core substrate 20, and solder resist layers 70, 80, which respectively cover the wiring lamination units 30, 40. The solder resist layers 70, 80 each function as a protective insulation layer.

The core substrate 20 is a glass-epoxy substrate obtained, for example, by impregnating a glass cloth (glass woven-cloth), which is a reinforcement material, with a thermosetting insulative resin, the main component of which is an epoxy resin, and curing the resin. Instead of the glass-epoxy substrate, the core substrate 20 may be, for example, a substrate in which a woven or non-woven cloth of glass fibers, carbon fibers, aramid fibers, or the like is impregnated with an epoxy resin or the like.

Through holes 20X extend through the core substrate 20 in the thickness-wise direction at given locations. Each through hole 20X includes a through electrode 21, which extends between the upper surface 20A and the lower surface 20B of the core substrate 20. The material of the through electrodes 21 is, for example, copper (Cu) or a copper alloy. A wiring layer 22 is formed on the upper surface 20A of the core substrate 20. A wiring layer 23 is formed on the lower surface 20B of the core substrate 20. The wiring layers 22, 23 are electrically connected by the through electrodes 21. The material of the wiring layers 22, 23 is, for example, copper or a copper alloy.

The wiring lamination unit 30 includes an insulation layer 31 and a wiring layer 32. The insulation layer 31 is arranged on the upper surface 20A of the core substrate 20 to cover the wiring layer 22. The wiring layer 32 is located on an upper surface 31A of the insulation layer 31. The insulation layer 31 includes a via hole 31X, which extends through the insulation layer 31 from the upper surface 31A of the insulation layer 31 to an upper surface of the wiring layer 22. The wiring layer 32 includes a via 32V, which is located in the via hole 31X, and a wiring pattern 32P, which is located on the upper surface 31A of the insulation layer 31. The via 32V electrically connects the wiring pattern 32P and the wiring layer 22.

The material of the insulation layer 31 may be, for example, an insulative resin such as an epoxy resin or a polyimide resin or a resin material in which such an insulative resin is mixed with a filler such as silica or alumina. The material of the wiring layer 32 is, for example, copper or a copper alloy.

The wiring lamination unit 40 includes an insulation layer 41 and a wiring layer 42. The insulation layer 41 is arranged on the lower surface 20B of the core substrate 20 to cover the wiring layer 23. The wiring layer 42 is located on a lower surface of the insulation layer 41. The insulation layer 41 includes a via hole 41X, which extends from the lower surface of the insulation layer 41 to a lower surface of the wiring layer 23. The wiring layer 42 includes a via 42V, which is located in the via hole 41X, and a wiring pattern 42P, which is located on the lower surface of the insulation layer 41. The via 42V electrically connects the wiring pattern 42P and the wiring layer 23.

The material of the insulation layer 41 may be, for example, an insulative resin such as an epoxy resin or a polyimide resin or a resin material in which such an insulative resin is mixed with a filler such as silica or alumina. The material of the wiring layer 42 is, for example, copper or a copper alloy.

The wiring pattern 32P includes a first metal layer 51 and a second metal layer 52. The first metal layer 51 is located on the upper surface 31A of the insulation layer 31. Although not particularly limited, the contour of the first metal layer 51 may be, for example, circular in a plan view as illustrated in FIG. 1A. The first metal layer 51 is located at a position corresponding to one of the connection terminals (bumps 102) of the semiconductor element 100, which is illustrated in FIG. 2. The solder resist layer 70 includes an opening 70X at a position corresponding to the first metal layer 51. The dimension (diameter) of the first metal layer 51 is greater than the dimension (diameter) of the opening 70X. For example, the diameter of the opening 70X is 40 μm, and the diameter of the first metal layer 51 is 60 μm. The thickness of the first metal layer 51 is, for example, 15 μm.

The second metal layer 52 includes a pad portion 53, a wiring portion 54, and a pad portion 55. The pad portion 53 covers a side surface of the first metal layer 51 and an upper surface of the first metal layer 51. The contour of the pad portion 53 is, for example, circular in a plan view. The pad portion 55 is connected to the wiring layer 22 by the via 32V. The contour of the pad portion 55 is, for example, circular in a plan view. The wiring portion 54 connects the pad portions 53, 55. The wiring portion 54 of the second metal layer 52 has a thickness of, for example, 15 μm.

The opening 70X of the solder resist layer 70 exposes a portion of the second metal layer 52. In the present example, the opening 70X exposes a central part of a circular upper surface 53A of the pad portion 53, which covers the first metal layer 51. The part of the upper surface 53A of the pad portion 53 exposed by the opening 70X functions as a connection pad that is connected to the semiconductor element 100, which is illustrated in FIG. 2.

As illustrated in FIG. 1B, the upper surface 53A of the pad portion 53 is domical and upwardly bulged. The upper surface 53A of the pad portion 53 includes a peripheral portion 53B, which is, for example, convex and rounded in a cross-sectional view. The peripheral portion 53B is continuously curved from the upper surface 53A of the pad portion 53 to a side surface 53C of the pad portion 53. The peripheral portion 53B is covered by the solder resist layer 70.

The opening 70X of the solder resist layer 70 is formed, for example, through photolithography. The solder resist layer 70 may be, for example, a photosensitive dry film resist or a liquid photoresist. Such a resist material may be, for example, a novolac resin or an acryl resin. For example, when a photosensitive dry film resist is used, the upper surface 31A of the insulation layer 31 and the wiring layer 32 are laminated with a dry film through thermocompression bonding. The dry film is patterned through photolithography to form the solder resist layer 70 that includes the opening 70X. When a liquid photoresist is used, the solder resist layer 70 may be formed through the same steps.

The thickness of the pad portion 53 is, for example, 15 μm from the upper surfaces of the wiring portion 54 and the pad portion 55 to the upper surface 53A (central part, or uppermost part) of the pad portion 53. The thickness of the solder resist layer 70 is, for example, 25 μm from the upper surfaces of the wiring portion 54 and the pad portion 55 to the upper surface 70A of the solder resist layer 70. That is, the thickness of the solder resist layer 70 is approximately 25 μm at a portion covering the wiring portion 54 and the pad portion 55. The distance from the upper surface 70A of the solder resist layer 70 to the upper surface 53A (central part, or uppermost part) of the pad portion 53, that is, the depth of the opening 70X at the central part, is, for example, 10 μm.

The wiring pattern 42P is formed by a single metal layer and includes a pad portion 61, a wiring portion 62, and a pad portion 63. The contour of the pad portion 61 is, for example, circular in a plan view. The solder resist layer 80 covers a peripheral portion of the pad portion 61. The pad portion 63 is connected to the wiring layer 23 by the via 42V. The wiring portion 62 connects the pad portions 61, 63. The solder resist layer 80 includes an opening 80X, which is formed, for example, in the same manner as the opening 70X in the solder resist layer 70.

Various comparative examples will now be described. In the description of the comparative examples, the same reference characters are given to those components that are the same as the corresponding components of the wiring substrate 10.

Figure 3A:
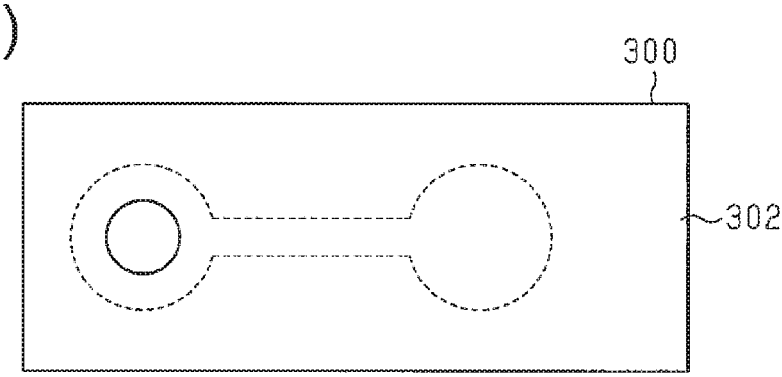
FIG. 3A is a schematic plan view illustrating a first comparative example of a wiring substrate.
Figure 3B:
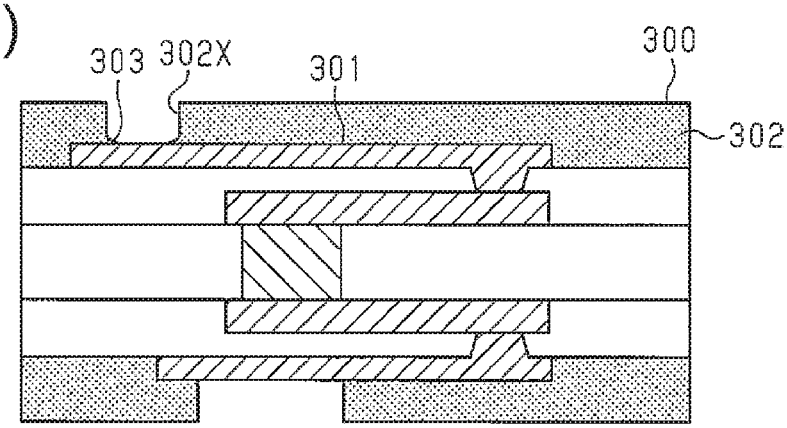
FIG. 3B is a schematic cross-sectional view illustrating the wiring substrate of FIG. 3A.

FIGS. 3A and 3B illustrate a first comparative example of a wiring substrate 300. The wiring substrate 300 includes a wiring layer 301, which is formed by a single metal layer. Namely, the wiring substrate 300 does not include the first metal layer 51, which is illustrated in FIG. 1B. A solder resist layer 302 includes an opening 302X, which partially exposes the upper surface of a wiring layer 301 as a pad. The opening 302X of the solder resist layer 302 and the opening 70X of the above embodiment have the same size (e.g., 40 µm). The thickness of the solder resist layer 302 formed on the wiring layer 301, that is, the depth of the opening 302X, is, for example, 25 µm.

In the wiring substrate 300 of the first comparative example, the aspect ratio of the opening 302X of the solder resist layer 302, that is, the ratio of the depth of the opening 302X to the diameter of the opening 302X, is 0.625. The aspect ratio of the opening 70X of the above embodiment is 0.25. The aspect ratio of the opening 302X is greater than the aspect ratio of the opening 70X. Thus, when forming the opening 302X through photolithography, a residue 303 tends to be formed on the bottom of the opening 302X. The residue 303 may lead to a connection defect between the wiring layer 301 and an electrode of the semiconductor device connected to the wiring layer 301.

Figure 4:
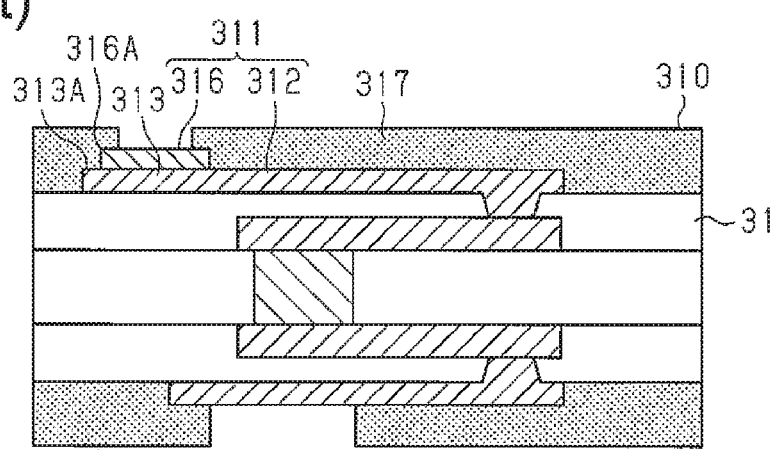
FIG. 4 is a schematic cross-sectional view illustrating a second comparative example of a wiring substrate.

FIG. 4 illustrates a second comparative example of a wiring substrate 310. The wiring substrate 310 includes a wiring layer 311. The wiring layer 311 includes a first metal layer 312, which is formed on an upper surface of the insulation layer 31, and a second metal layer 316, which is formed on an upper surface of the first metal layer 312. The shape of the first metal layer 312 is similar to that of the second metal layer 52 (refer to FIG. 1A) of the above embodiment in a plan view. The first metal layer 312 includes a pad portion 313. The pad portion 313 includes an upper surface 313A on which the second metal layer 316 is formed. A solder resist layer 317 is formed to cover a peripheral portion 316A of the second metal layer 316.

In the second comparative example, the peripheral portion 316A of the second metal layer 316 has a cross-section that forms a substantially right angle. In this structure, when stress is generated due to bending of the wiring substrate 310 or contraction of the solder resist layer 317, the stress concentrates on the solder resist layer 317 at the location of the peripheral portion 316A. This may form cracks or the like in the solder resist layer 317.

As illustrated in FIG. 1B, in the present embodiment, the second metal layer 52 covers the first metal layer 51. The opening 70X in the solder resist layer 70 has a depth of approximately 10 µm and is shallow because of the arrangement of the first metal layer 51 and the second metal layer 52. Thus, the opening 70X has a small aspect ratio of approximately 0.25. A small aspect ratio (e.g., 0.3 or less) of the opening 70X limits residues of the solder resist layer 70 remaining on the bottom of the opening 70X, that is, the upper surface (upper surface 53A of pad portion 53) of the second metal layer 52. Thus, the electrode of the semiconductor element 100 is connected to the second metal layer 52 (pad portion 53) in a satisfactory manner.

The upper surface 53A of the pad portion 53 is domical and upwardly bulged. This structure increases the surface area of the pad portion 53 as compared to the second metal layer 316 having the flat upper surface, which is illustrated in FIG. 4. This increases the connection reliability of the solder members 102 used for a connection with the semiconductor element 100 (refer to FIG. 2).

The second metal layer 52 covers the upper surface and the side surface of the first metal layer 51. Thus, in the second metal layer 52, the peripheral portion 53B is continuously curved from the upper surface 53A of the pad portion 53 to the side surface 53C of the pad portion 53. This structure prevents stress from concentrating on the solder resist layer 70 at the location of the peripheral portion 53B. This limits formation of cracks or the like in the solder resist layer 70.

A method for manufacturing the wiring substrate 10 will now be described.

Figure 5A:
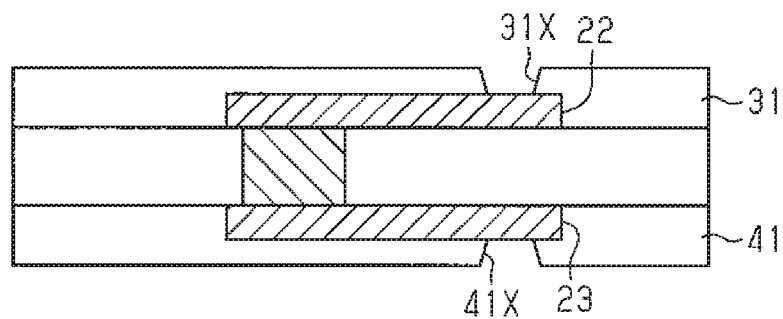
FIGS. 5A to 5C, 6A to 6C, 7A to 7C, and 8 are schematic cross-sectional views of a method for manufacturing the wiring substrate of FIG. 1B.

As illustrated in FIG. 5A, the via holes 31X, 41X are respectively formed in the uppermost insulation layer 31 and the lowermost insulation layer 41, which are formed, for example, through a build-up process, to partially expose the wiring layers 22, 23. The via holes 31X, 41X are formed, for example, through laser cutting. When the insulation layers 31, 41 are formed from a photosensitive resin, for example, photolithography may be performed to form the via holes 31X, 41X. When laser cutting is performed to form the via holes 31X, 41X, a desmear process is performed to remove residues (resin smears) from the via holes 31X, 41X.

Figure 5B:
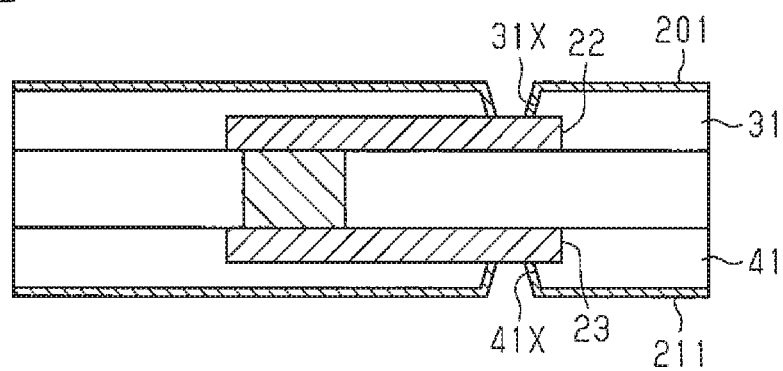

As illustrated in FIG. 5B, seed layers 201, 211 are formed to cover surfaces of the insulation layers 31, 41. The seed layer 201 covers the upper surface of the insulation layer 31 and a wall surface of the insulation layer 31 defining the via hole 31X. The seed layer 211 covers the lower surface of the insulation layer 41 and a wall surface of the insulation layer 41 defining the via hole 41X. The seed layers 201, 211 are each a metal film formed, for example, through an electroless plating process. The material of the seed layers 201, 211 may be, for example, copper or a copper alloy.

Figure 5C:
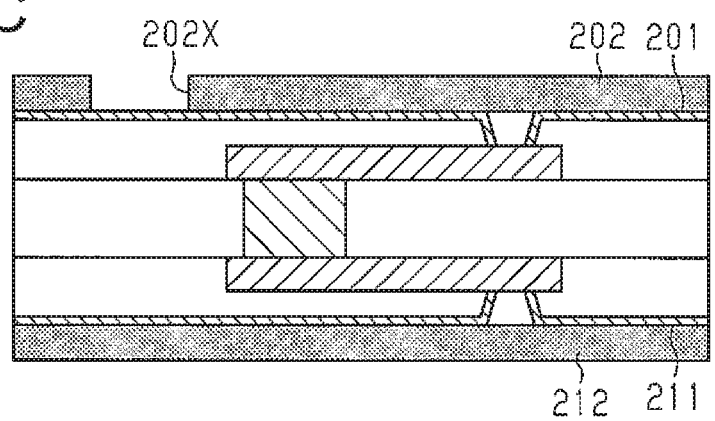

As illustrated in FIG. 5C, a resist layer 202 that includes an opening 202X is formed on a surface of the seed layer 201. The opening 202X exposes the seed layer 201 at a location corresponding to the region where the first metal layer 51 of FIG. 1B is formed.

The material of the resist layer 202 may have resistance, for example, to plating performed in the next step. The material of the resist layer 202 may be, for example, a photosensitive dry film resist (e.g., dry film resist of novolac resin or acryl resin). For example, the upper surface of the seed layer 201 is laminated with a dry film through thermocompression bonding. The dry film is patterned through photolithography to form the resist layer 202 that includes the opening 202X. Alternatively, a liquid photoresist (e.g., liquid resist of novolac resin or acryl resin) may be used to form the resist layer 202.

In the same manner, a resist layer 212 is formed on a surface of the seed layer 211. In the same manner as the resist layer 202, the material of the resist layer 212 may have resistance, for example, to plating performed in the next step. The material of the resist layer 212 may be, for example, a photosensitive dry film resist or a liquid photoresist (e.g., dry film resist or liquid resist of novolac resin or acryl resin).

Figure 6A:
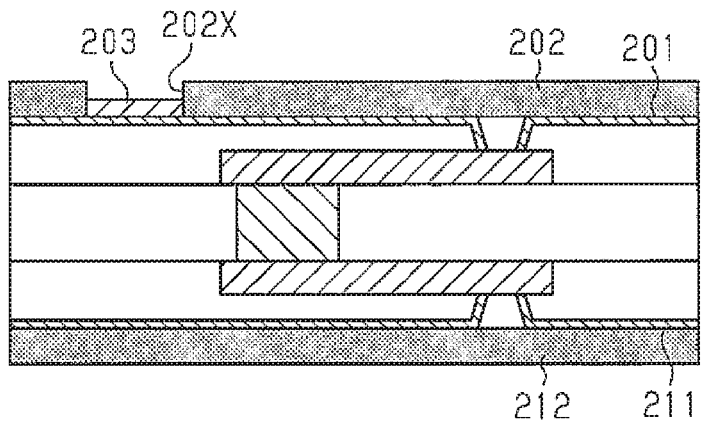

As illustrated in FIG. 6A, electrolytic plating (in present example, electrolytic copper plating) is performed on the upper surface of the seed layer 201 using the resist layer 202 as a plating mask and the seed layer 201 as a plating power feeding layer. This forms an electrolytic copper plating layer 203 on the upper surface of the seed layer 201 exposed from the opening 202X of the resist layer 202. The electrolytic copper plating layer 203 is, for example, circular in a plan view and has a diameter of, for example, 60 μm and a thickness of, for example, 15 μm.

Figure 6B:
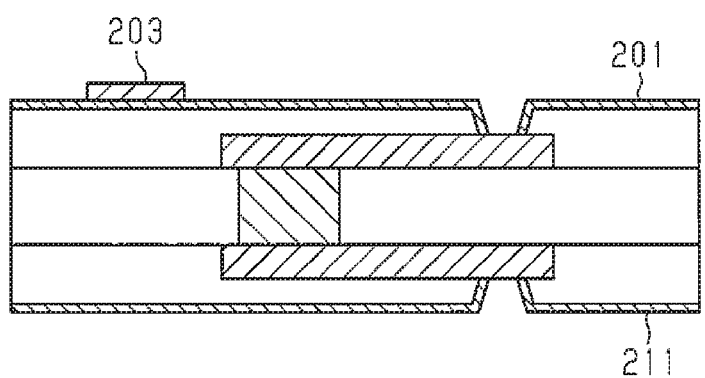

As illustrated in FIG. 6B, the resist layers 202, 212 are removed. For example, an alkaline remover may be used to remove the resist layers 202, 212.

Figure 6C:
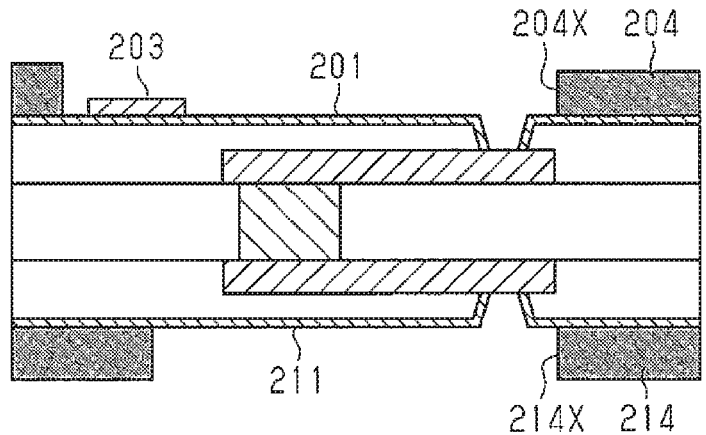

As illustrated in FIG. 6C, a resist layer 204 that includes an opening 204X is formed on the surface of the seed layer 201. The opening 204X exposes the seed layer 201 and the electrolytic copper plating layer 203 at a location corresponding to the region where the wiring layer 32 (second metal layer 52) of FIG. 1B is formed.

In the same manner, a resist layer 214 that includes an opening 214X is formed on the surface of the seed layer 211. The opening 214X exposes the seed layer 211 at a location corresponding to the region where the wiring layer 42 of FIG. 1B is formed.

In the same manner as the resist layers 202, 212, the material of the resist layers 204, 214 may have resistance, for example, to plating performed in the next step. The material of the resist layers 204, 214 may be, for example, a photosensitive dry film resist or a liquid photoresist (e.g., dry film resist or liquid resist of novolac resin or acryl resin).

Figure 7A:
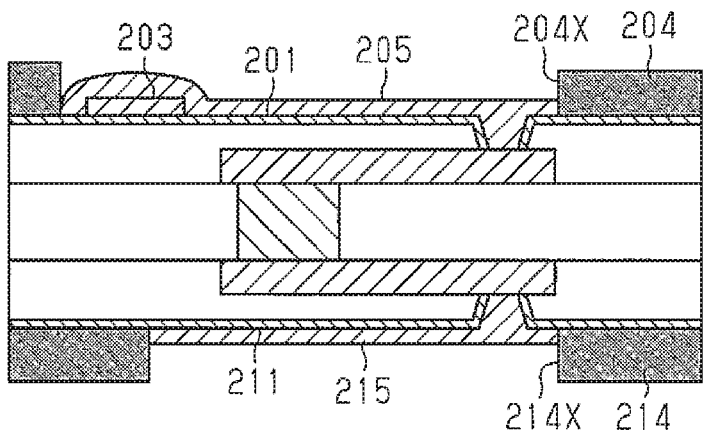

As illustrated in FIG. 7A, electrolytic plating (in present example, electrolytic copper plating) is performed using the resist layers 204, 214 as plating masks and the seed layers 201, 211 as plating power feeding layers. Consequently, an electrolytic copper plating layer 205 is formed on the upper surface of the seed layer 201 exposed from the opening 204X of the resist layer 204 and side and upper surfaces of the electrolytic copper plating layer 203. Also, an electrolytic copper plating layer 215 is formed on the lower surface of the seed layer 211 exposed from the opening 214X of the resist layer 214. The thickness of each of the electrolytic copper plating layers 205, 215 is, for example, 15 μm.

Figure 7B:
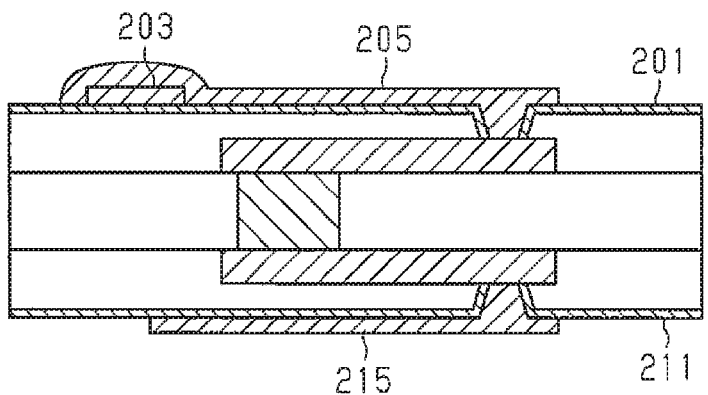

As illustrated in FIG. 7B, the resist layers 204, 214 (refer to FIG. 6A) are removed. For example, an alkaline remover may be used to remove the resist layers 204, 214.

Figure 7C:
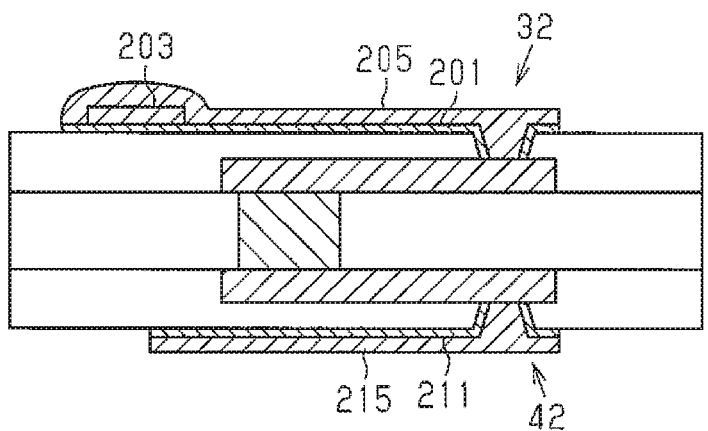

As illustrated in FIG. 7C, for example, flash etching is performed using the electrolytic copper plating layers 205, 215 as etching masks to remove the seed layers 201, 211 exposed from the electrolytic copper plating layers 205, 215. This obtains the wiring layer 32, which is formed by the electrolytic copper plating layer 205, the electrolytic copper plating layer 203, and the seed layer 201, and the wiring layer 42, which is formed by the electrolytic copper plating layer 215 and the seed layer 211. In the present example, the electrolytic copper plating layer 203 and a first portion of the seed layer 201 located immediately below the electrolytic copper plating layer 203 form the first metal layer 51. Further, the electrolytic copper plating layer 205 and a second portion of the seed layer 201 located immediately below the electrolytic copper plating layer 205 form the second metal layer 52. The electrolytic copper plating layer 205 is formed on the first metal layer 51 and the second portion of the seed layer 201.

Figure 8:
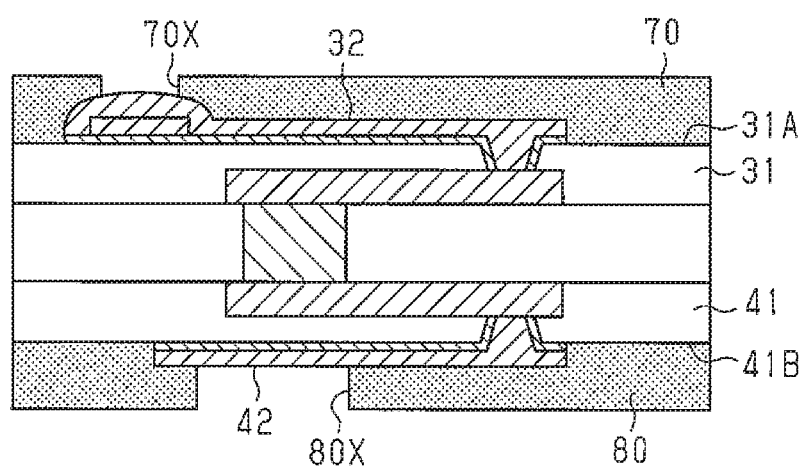

As illustrated in FIG. 8, the solder resist layer 70 that includes the opening 70X is formed on the upper surface 31A of the insulation layer 31. Also, the solder resist layer 80 that includes the opening 80X is formed on the lower surface 41B of the insulation layer 41. The solder resist layer 70 is obtained, for example, by laminating a photosensitive solder resist film on or applying a liquid solder resist to the upper surface 31A of the insulation layer 31 and performing photolithography to expose and develop the resist to obtain a pattern having a predetermined shape. The solder resist layer 80 may be formed in the same manner as the solder resist layer 70.

The present embodiment has the advantages described below.

(1) The wiring substrate 10 includes the wiring layer 32, which is formed on the upper surface 31A of the insulation layer 31. The wiring layer 32 includes the first metal layer 51 and the second metal layer 52. The first metal layer 51 is located on the upper surface 31A of the insulation layer 31. The second metal layer 52 includes the pad portion 53 and the wiring portion 54. The pad portion 53 covers the upper surface and the side surface of the first metal layer 51. The upper surface 31A of the insulation layer 31 and the wiring layer 32 are covered by the solder resist layer 70 (protective insulation layer). The solder resist layer 70 includes the opening 70X, which partially exposes the upper surface 53A of the pad portion 53. The opening 70X is extended in the solder resist layer 70 from the upper surface 70A of the solder resist layer 70 to the upper surface 53A of the pad portion 53 by a distance that is shorter than that from the upper surface 70A of the solder resist layer 70 to the upper surface of the wiring portion 54. That is, the distance from the upper end to the lower end of opening 70X is shorter than that from the upper surface 70A of the solder resist layer 70 to the upper surface of the wiring portion 54.

In the wiring substrate 10, the solder resist layer 70 is formed to have a thickness such that the wiring layer 32 does not project from the upper surface 70A of the solder resist layer 70. The first metal layer 51 is covered by the pad portion 53 of the second metal layer 52. The opening 70X in the solder resist layer 70 has a depth of, for example, 10 μm and is shallow because of the arrangement of the first metal layer 51 and the pad portion 53. Thus, the opening 70X has a small aspect ratio of approximately 0.25. A small aspect ratio (e.g., 0.3 or less) of the opening 70X limits residues of the solder resist layer 70 remaining on the upper surface (upper surface 53A of pad portion 53) of the second metal layer 52. Thus, the electrode of the semiconductor element 100 is connected to the pad portion 53 in a satisfactory manner.

(2) The upper surface 53A of the pad portion 53 is domical and upwardly bulged. This structure increases the surface area of the pad portion 53 as compared to the second metal layer 316 having the flat upper surface, which is illustrated in FIG. 4. This increases the connection reliability of the solder members 102 used for a connection with the semiconductor element 100 (refer to FIG. 2).

(3) The second metal layer 52 is formed to cover the upper surface and the side surface of the first metal layer 51. Thus, in the second metal layer 52, the peripheral portion 53B is continuously curved from the upper surface 53A of the pad portion 53 to the side surface 53C of the pad portion 53. This structure prevents stress from concentrating on the solder resist layer 70 at the location of the peripheral portion 53B. This limits formation of cracks or the like in the solder resist layer 70.

It should be apparent to those skilled in the art that the foregoing embodiments may be employed in many other specific forms without departing from the scope of this disclosure. Particularly, it should be understood that the foregoing embodiments may be employed in the following forms.

In the above embodiment, the wiring substrate 10 only needs to have a structure for electrically connecting the wiring layer 32 and the wiring layer 42. Thus, a wiring layer may or may not be formed in the wiring substrate 10. Further, the wiring substrate 10 may be, for example, a coreless wiring substrate that does not include the core substrate 20. Alternatively, the core substrate 20 may be a build-up substrate that includes a plurality of wiring layers. The wiring lamination units 30, 40 may each include a plurality of insulation layers and wiring layers.

In the above embodiment, if necessary, a surface-processed layer, which serves as a metal layer, may be formed on the surface of the wiring layer 32 (second metal layer 52) exposed from the opening 70X of the solder resist layer 70. The surface-processed layer may be, for example, a two-layer metal layer in which a nickel layer (Ni layer) and a gold layer (Au layer) are sequentially formed. Such a metal layer may be formed, for example, through an electroless plating process. In the same manner, a surface-processed layer (metal layer) may be formed on the surface of the wiring layer 42 exposed from the opening 80X of the solder resist layer 80.

The above embodiment illustrates one example of the shape and the size of each component. The shape and the size may be modified.

Clause

This disclosure further encompasses the following embodiment.

A method for manufacturing a wiring substrate, the method including:

forming a first metal layer on an insulation layer;

forming a second metal layer including a pad portion, wherein the pad portion covers the first metal layer;

forming a protective insulation layer on the insulation layer to cover the second metal layer; and forming an opening in the protective insulation layer, wherein the opening partially exposes an upper surface of the pad portion.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The inventin claimed is:

1. A wiring substrate comprising:
    a wiring layer located on an insulation layer; and
    a protective insulation layer located on the insulation layer and the wiring layer to cover the wiring layer and the insulation layer, wherein
    the protective insulation layer includes an opening that partially exposes the wiring layer,
    the wiring layer includes
        a first metal layer located at a position corresponding to the opening, wherein the first metal layer has a larger contour than the opening in a plan view, and
        a second metal layer including a pad portion and a wiring portion, wherein the pad portion covers an upper surface of the first metal layer and a side surface of the first metal layer,
    the opening of the protective insulation layer partially exposes an upper surface of the pad portion, and
    the opening is extended in the protective insulation layer from an upper surface of the protective insulation layer to the upper surface of the pad portion by a distance that is shorter than that from the upper surface of the protective insulation layer to an upper surface of the wiring portion.

2. The wiring substrate according to claim 1, wherein the upper surface of the pad portion is domical and upwardly bulged.

3. The wiring substrate according to claim 1, wherein
    the upper surface of the pad portion includes a peripheral portion that is continuously curved from the upper surface of the pad portion to a side surface of the pad portion, and
    the peripheral portion of the upper surface of the pad portion is covered by the protective insulation layer.

4. The wiring substrate according to claim 1, wherein the first metal layer is circular in a plan view and has a diameter that is greater than a diameter of the opening.

5. The wiring substrate according to claim 4, wherein the pad portion of the second metal layer is circular in a plan view and has a diameter that is greater than the diameter of the first metal layer.

6. The wiring substrate according to claim 1, wherein the upper surface of the first metal layer is at a same level as the upper surface of the wiring portion of the second metal layer.

7. The wiring substrate according to claim 1, wherein the protective insulation layer is an uppermost insulation layer.

8. The wiring substrate according to claim 1, wherein
    the wiring layer further includes a seed layer formed on the insulation layer;
    the first metal layer includes
        a first portion of the seed layer, and
        a plating layer formed on the first portion of the seed layer; and
    the second metal layer includes
        a second portion of the seed layer other than the first portion, and
        a plating layer formed on the first metal layer and the second portion of the seed layer.

9. The wiring substrate according to claim 1, wherein
    the pad portion is located at one end of the wiring portion, and
    the second metal layer further includes a further pad located at another end of the wiring portion, wherein the further pad is connected to an upper surface of a via formed in the insulation layer.

10. A semiconductor device comprising:
    the wiring substrate according to claim 1; and
    a semiconductor element mounted on the wiring substrate and connected to the pad portion.

* * * * *